(12) United States Patent
Torii et al.

(10) Patent No.: US 9,204,534 B2
(45) Date of Patent: Dec. 1, 2015

(54) PANEL UNIT THAT REDUCES INFLUENCE OF STATIC ELECTRICITY, AND ELECTRONIC APPARATUS

(71) Applicant: CANON KABUSHIKI KAISHA, Tokyo (JP)

(72) Inventors: Shinnosuke Torii, Kawasaki (JP); Takayuki Wada, Kawasaki (JP)

(73) Assignee: CANON KABUSHIKI KAISHA (JP)

( * ) Notice: Subject to any disclaimer, the term of this patent is extended or adjusted under 35 U.S.C. 154(b) by 0 days.

(21) Appl. No.: 14/133,786

(22) Filed: Dec. 19, 2013

(65) Prior Publication Data

US 2014/0177176 A1   Jun. 26, 2014

(30) Foreign Application Priority Data

Dec. 21, 2012   (JP) ................................. 2012-279468

(51) Int. Cl.
| | |
|---|---|
| H05K 1/11 | (2006.01) |
| H05K 7/06 | (2006.01) |
| H05K 1/00 | (2006.01) |
| H05K 1/02 | (2006.01) |
| G06F 3/00 | (2006.01) |

(52) U.S. Cl.
CPC ................ *H05K 1/0259* (2013.01); *G06F 3/00* (2013.01); *H05K 2201/09354* (2013.01)

(58) Field of Classification Search
CPC .................. H05K 2201/09354; H05K 1/0218; H05K 1/0259
USPC .......................................... 361/748, 750, 751
See application file for complete search history.

(56) References Cited

U.S. PATENT DOCUMENTS

| | | | | |
|---|---|---|---|---|
| 4,748,293 | A * | 5/1988 | Kikuchi et al. ................ | 174/268 |
| 6,316,734 | B1 * | 11/2001 | Yang .............................. | 174/256 |
| 8,344,257 | B2 * | 1/2013 | Wu et al. ....................... | 174/250 |
| 8,798,694 | B2 * | 8/2014 | Morishita et al. ........... | 455/575.3 |
| 8,879,020 | B2 * | 11/2014 | Liu | |
| 2007/0181996 | A1 * | 8/2007 | Chang et al. .................. | 257/701 |
| 2008/0144295 | A1 * | 6/2008 | Wang et al. ................... | 361/750 |
| 2009/0231816 | A1 * | 9/2009 | Lin ................ | 361/751 |
| 2011/0210929 | A1 * | 9/2011 | Hiranobu ...................... | 345/173 |
| 2012/0020416 | A1 * | 1/2012 | Shimura et al. ............... | 375/257 |
| 2013/0265678 | A1 * | 10/2013 | Lin ................................ | 361/56 |
| 2014/0022744 | A1 * | 1/2014 | Joo | |
| 2014/0092034 | A1 * | 4/2014 | Franklin et al. ............... | 345/173 |

(Continued)

FOREIGN PATENT DOCUMENTS

| | | |
|---|---|---|
| JP | 2000-305715 A | 11/2000 |
| JP | 2002-323691 A | 11/2002 |

(Continued)

*Primary Examiner* — Jeremy C Norris
*Assistant Examiner* — Nathan Milakovich
(74) *Attorney, Agent, or Firm* — Rossi, Kimms & McDowell LLP

(57) ABSTRACT

A panel unit that reduces the influence of static electricity applied to a panel member forming a display surface without increasing the size of an electronic apparatus. The panel unit has a touch panel and an FPC including connection sections which are electrically connected to interconnection sections of the touch panel, and is provided with signal lines and a ground interconnection. The FPC includes conductor-exposed portions each provided between the connection sections connected to the interconnection sections and an outer part of the touch panel. The conductor-exposed portions are configured to be prevented from being electrically conducted to the signal lines, and be electrically conducted to the ground interconnection.

16 Claims, 16 Drawing Sheets

(56) References Cited

U.S. PATENT DOCUMENTS

2014/0092510 A1* 4/2014 Huang ........................... 361/56
2015/0173176 A1* 6/2015 Lee ............................... 361/749

FOREIGN PATENT DOCUMENTS

JP        2010-039515 A     2/2010
WO   WO 2006075381 A1 *  7/2006

* cited by examiner

PANEL UNIT THAT REDUCES INFLUENCE OF STATIC ELECTRICITY, AND ELECTRONIC APPARATUS

BACKGROUND OF THE INVENTION

1. Field of the Invention

The present invention, relates to a panel unit that is mounted on an image pickup apparatus including a digital video camera, and an electronic apparatus including a mobile communication apparatus, such as a cellular phone, a smartphone, and a tablet device, and reduces the influence of static electricity, and an electronic apparatus including the panel unit.

2. Description of the Related Art

Touch panels mounted on display panels of display units of image pickup apparatuses, such as digital video cameras, and mobile communication apparatuses, such as smartphones, are largely classified into two types: resistance film-type touch panels and electrostatic capacity-type touch panels.

In general, in the above-mentioned two types of touch panels, a frame area is required to be provided along an outer periphery of a position detection area in which position detection can be performed, as shown in FIG. 21.

The resistance film-type touch panel includes an upper electrode and a lower electrode fixed with a fixed spacing therebetween, and when an operator presses the upper electrode, the upper electrode is deformed to cause conduction between the upper electrode and the lower electrode. The position of a pressed point is detected from this conduction. Further, to hold the upper electrode and the lower electrode with the fixed spacing therebetween, a support structure, such as a spacer, is required to be provided on the outer periphery of the position detection area, and the support structure and interconnection cables for signal detection are arranged on the frame area shown in FIG. 21 (see Japanese Patent Laid-Open Publication No. 2000-305715).

On the other hand, the electrostatic capacity-type touch panel performs position detection by detecting a change in electrostatic capacity between a fingertip of the operator and a conductive film (see Japanese Patent Laid-Open Publication No. 2010-39515).

Further, in general, to transmit a signal output from the touch panel e.g. to a drive circuit mounted on another substrate, the above-mentioned two types of touch panels nave a interconnection member connected thereto, and the interconnection member is provided in a manner protruding from the frame area.

The interconnection member is generally in the form of an FPC (flexible printed circuit board) or the like. One end of the interconnection member is fixedly attached to a connection part of the conductive film of the touch panel for electrical and mechanical connection thereto, and the other end of the interconnection member has a terminal section thereof connected to a circuit board on which a drive circuit and so forth are mounted, using a connector or by soldering.

By the way, when using the touch panel, a finger, a pen, or the like, which touches the touch panel, is often electrostatically charged. For this reason, when the finger, the pen, or the like, is brought into contact with the surface of the touch panel, noise generated by the charged static electricity is transmitted to the touch panel and the circuit board via an exposed portion of the conductive film and the interconnection member, which may degrade the accuracy of position detection or cause a malfunction.

As a countermeasure against static electricity, there has been proposed a technique for reducing the influence of static electricity by disposing a conductor, which functions similar to a lightning rod, on the exposed portion of the conductive film, and further connecting the conductor to an electrically conductive casing to thereby guide static electricity toward the casing (see Japanese Patent Laid-Open Publication No. 2002-323691).

However, in Japanese Patent Laid-Open Publication No. 2002-323691, static electricity charged e.g. on the finger or the pen is applied from the front side of the touch panel. Therefore, the conductor which functions similar to the lightning rod is required to be arranged on the front side of the conductive film and the interconnection member, which increases the size of the display unit, and in turn, the size of the electronic apparatus. Further, recent digital video cameras, mobile communication apparatuses, etc. employ a flat panel-type display unit which is designed to form a surface of the touch panel and a surface of an external cover such that they are flush with each other. It is difficult to dispose the above-mentioned conductor, which functions as a conductor rod, on such a display unit.

SUMMARY OF THE INVENTION

The present invention provides a panel unit that reduces the influence of static electricity applied to a panel member forming a display surface, without increasing the size of an electronic apparatus, and an electronic apparatus including the panel unit.

In a first aspect of the present invention, there is provided a panel unit comprising a panel member that forms a surface of displaying an image, the panel member having interconnection sections, and a signal interconnection member that includes connection sections which are electrically connected to the interconnection sections of the panel member, and is provided with signal lines and a ground interconnection, wherein the signal interconnection member includes conductor-exposed portions each provided between the connection sections connected to the interconnection sections and an outer part of the panel member, each conductor-exposed portion being formed such that a conductor is exposed, and wherein the conductor-exposed portions are configured to be prevented from being electrically conducted to the signal lines, and be electrically conducted to the ground interconnection.

In a second aspect of the present invention, there is provided an electronic apparatus comprising a panel unit including a panel member that forms a surface of displaying an image, the panel member having interconnection sections, and a signal interconnection member that includes connection sections which are electrically connected to the interconnection sections of the panel member, and is provided with signal lines and a ground interconnection, the signal interconnection member including conductor-exposed portions each provided between the connection sections connected to the interconnection sections and an outer part of the panel member, each conductor-exposed portion being formed such that a conductor is exposed, wherein the conductor-exposed portions are configured to be prevented from being electrically conducted to the signal lines, and be electrically conducted to the ground interconnection, and a cover member accommodating the panel member.

According to the present invention, it is possible to reduce the influence of static electricity applied to the panel member forming a display surface, without increasing the size of an electronic apparatus.

Further features of the present invention will become apparent from the following description of exemplary embodiments with reference to the attached drawings.

DESCRIPTION OF THE EMBODIMENTS

The present invention will now be described in detail below with reference to the accompanying drawings showing embodiments thereof.

Figure 1:
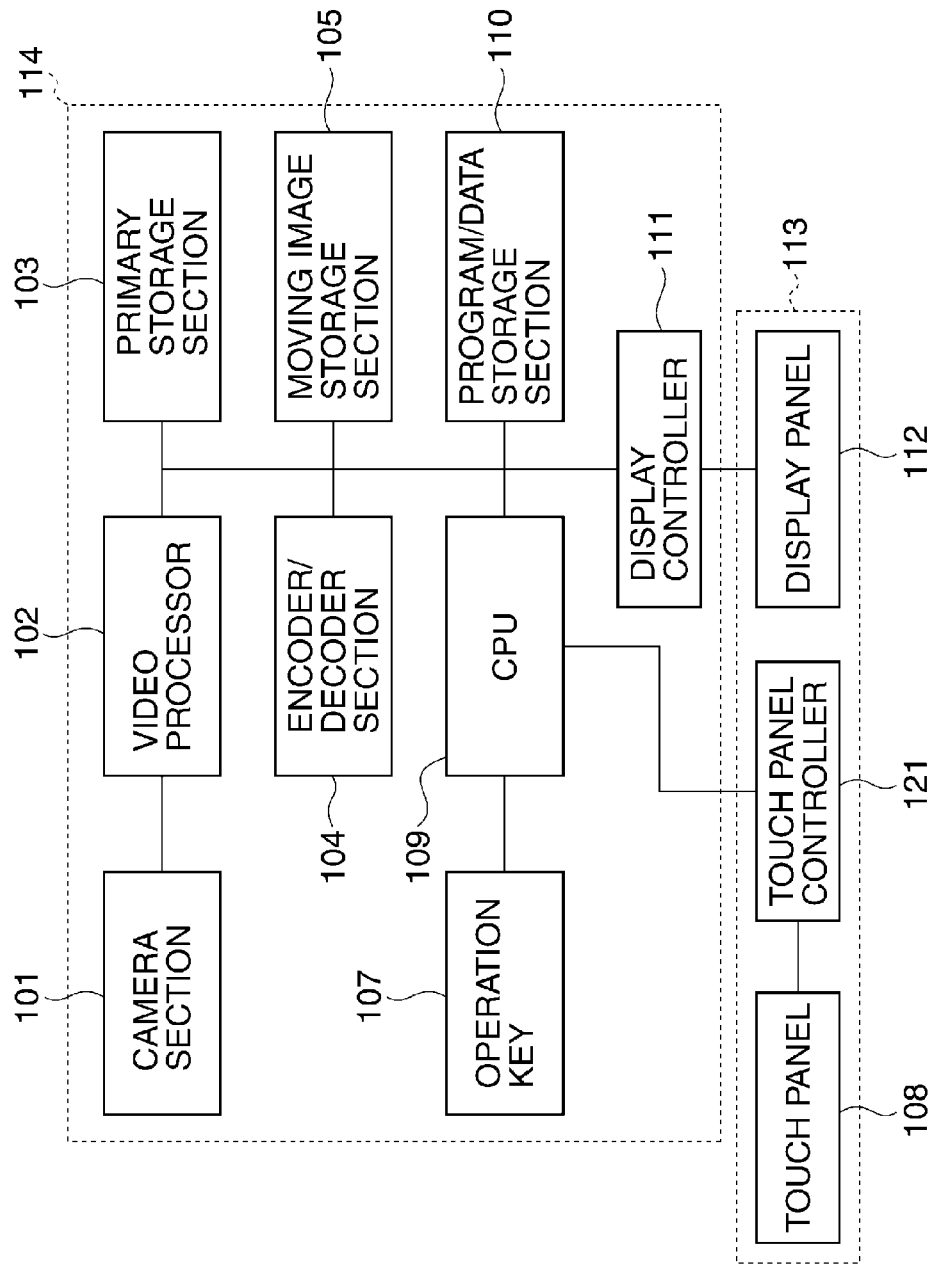
FIG. 1 is a schematic block diagram of a control system of a digital video camera which is an electronic apparatus according to a first embodiment of the present invention.

FIG. 1 is a schematic block diagram of a control system of a digital video camera as an electronic apparatus according to a first embodiment of the present invention.

Referring to FIG. 1, a CPU 109 reads a program from a program/data storage section 110, and controls the overall operation of the digital video camera according to the read program. The program read from the program/data storage section 110 functions to cause the CPU 109 to execute a plurality of tasks in parallel. The CPU 109 controls operations of a mode control task, a camera control task, a recorder control task, and a display control task, by executing the program. Further, part of a primary storage section 103 functions as a work area for the CPU 109, and provides a moving image frame buffer and an OSD frame buffer.

A camera section 101 includes a photographic lens (not shown) for causing an object light to form an image, an image pickup device (not shown) that performs photoelectric conversion on the object image formed by the photographic lens, a circuit (not shown) for driving the image pickup device, and so forth. The image pickup device generates an analog video signal by photoelectrically converting the object image.

A video processor 102 converts the analog video signal output from the camera section 101 to a digital signal, and performs predetermined signal processing on the digital signal to thereby generate moving image data. The operations of the camera section 101 and the video processor 102 are controlled according to the above-mentioned camera control task executed by the CPU 109.

An encoder/decoder section 104 encodes the moving image data output from the video processor 102. The moving image data encoded by the encoder/decoder section 104 is temporarily stored in the primary storage section 103, and then is stored in a moving image storage section 105 together with accompanying management data. The moving image storage section 105 is implemented by an internal memory, such as a hard disk and a flash memory, and a removable recording medium, such as a memory card.

When the moving image is reproduced, the encoded image data read from the moving image storage section 105 is decoded by the encoder/decoder section 104 using the primary storage section 103, and is loaded in the moving image frame buffer of the primary storage section 103 again. The control of the encoder/decoder section 104 and the moving image storage section 105 is performed according to the above-mentioned recorder control task executed by the CPU 109.

The management data read from the moving image storage section 105 is used for generating OSD (on screen display) data, i.e. characters displayed in a manner superimposed on a photographed image or a reproduced image, and a GUI (graphical user interface). Then, the generated OSD data is rendered in the OSD frame buffer of the primary storage section 103.

The data items respectively loaded in the moving image frame buffer and the OSD frame buffer are superimposed one on the other by a display controller 111, and the superimposed data is displayed on a display panel 112 implemented e.g. by an LCD. The control concerning the OSD data and the control of the display controller 111 and the display panel 112 are performed according to the above-mentioned control task executed by the CPU 109.

An operation key 107 provided on a camera body 114 and a touch panel 108 included in a display unit 113 are both operation units for receiving operation instructions from an operator. Note that in the present embodiment, the touch panel 108 is an electrostatic capacity-type touch panel. A touch panel controller 108 is also included in the display unit 113 and is connected to the CPU 109 and the touch panel 108.

Figure 2A:
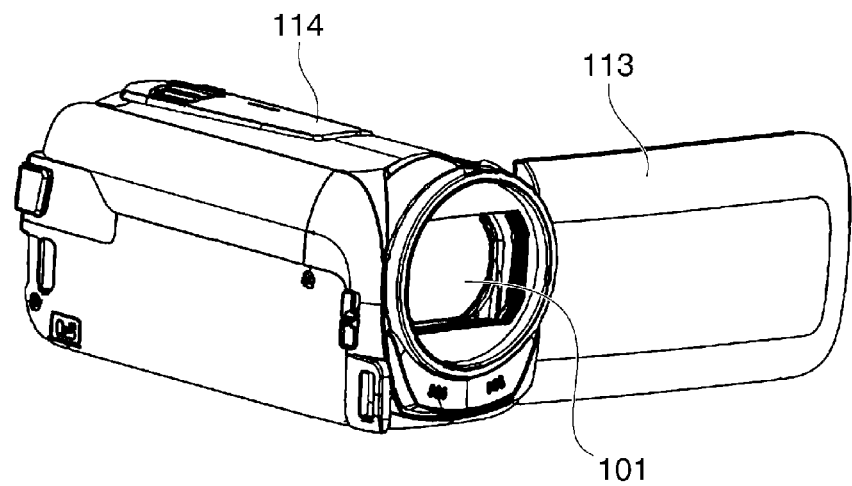
FIG. 2A is a perspective view of the appearance of the digital video camera, as viewed from the front.
Figure 2B:
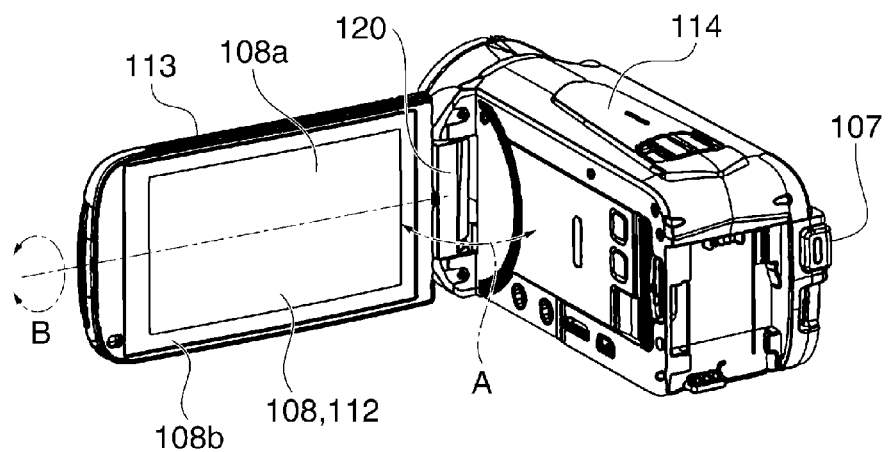
FIG. 2B is a perspective view of the appearance of the digital video camera shown in FIG. 2A, as viewed from the rear.
Figure 3:
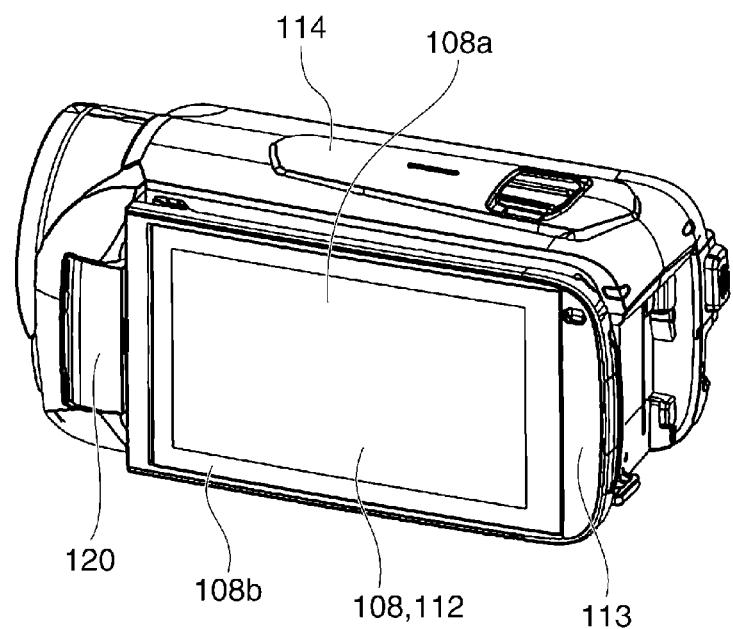
FIG. 3 is a perspective view of the appearance of the digital video camera, showing a state in which a display unit is turned over and received in a camera body.

FIG. 2A is a perspective view of the appearance of the digital video camera, as viewed from the front. FIG. 2B is a perspective view of the appearance of the digital video camera shown in FIG. 2A, as viewed from the rear. FIG. 3 is a perspective view of the appearance of the digital video camera, showing a state in which the display unit 113 is turned over and received in a camera body 114.

As shown in FIGS. 2A and 2B, the digital video camera has the camera body 114 including the camera section 101, and the display unit 113 which is supported by the camera body 114 via a hinge section 120 in a manner capable of opening and closing in a direction indicated by an arrow A in FIG. 2B. The display unit 113 can be rotated in a direction indicated by an arrow B in FIG. 2B when in an opened state. Therefore, as shown in FIG. 3, the display unit 113 can also be received in the camera body 114 in a state turned over with respect thereto.

The display unit 113 integrally incorporates the display panel 112, the touch panel controller 121, and the touch panel 108. The touch panel 108 has a position detection area 108a that is configured to have such a light transmittance as will not cause interference with the display on the display panel 112 and is provided as an upper layer of the display surface of the display panel 112, and a frame area 108b that is provided around the position detection area 108a.

The touch panel controller 121 controlled by the CPU 109 associates input coordinates on the touch panel 108 and display coordinates on the display panel 112. Further, the touch panel controller 121 detects an operation performed on the touch panel 108. This enables the operator to control the touch panel 108 based on information displayed on the display panel 112. With this arrangement, a GUI (graphical user interface) is formed which enables the operator to directly operate a screen displayed on the display panel 112.

More specifically, the touch panel controller 121 detects an operation of touching the touch panel 108 with a finger or a pen (hereinafter referred to as the touch-down operation), and also detects a state in which the touch panel 108 is in contact with the finger or the pen (hereinafter referred to as the touch-on operation). Further, the touch panel controller 121 detects a state in which the operator is moving the finger or the pen in a state touching the touch panel 108 therewith (hereinafter referred to as the move operation), and detects an operation of removing the finger or the pen from the touch panel 108 (hereinafter referred to as the touch-off operation). Each of these operations and coordinates of a position on the touch panel 108 being touched with the finger or the pen by the operation are notified to the touch panel controller 121. The touch panel controller 121 determines what operation has been performed on the touch panel 108 based on the notified information.

As for the move operation, the touch panel controller 121 also determines a direction of movement of the finger or the pen on the touch panel 108 by a vertical component, and a horizontal component of the movement on the touch panel 108 based on a change in the coordinates of the position.

Further, when the operator has performed the touch-off operation after moving the finger or the pen over a certain distance on the touch panel 108 from the touch-down operation, the touch panel controller 121 determines that the operator has performed a stroke operation. The operation for quickly performing the stroke operation is referred to as the flick operation. The flick operation is an operation for quickly moving a finger over a certain distance while touching the touch panel 108, and then removing the finger from the touch panel 108, i.e. an operation for quickly tracing the touch panel 108 in a manner flipping the touch panel 108.

When the touch panel controller 121 has detected the move operation performed over a predetermined distance or longer at a predetermined speed or higher, and then detected the touch-off operation performed directly thereafter, the touch panel controller 121 determines that the flick operation has been performed. Further, when the touch panel controller 121 has detected the move operation performed over the predetermined distance or longer at a speed lower than the predetermined speed, the touch panel controller 121 determines that a drag operation has been performed.

The above-mentioned mode control task executed by the CPU 109 operates as follows: According to an instruction from the operation key 107 or the touch panel 108, a request from any of the other tasks, or a change in internal status managed by the mode control task itself, the mode control task causes the overall operating state of the digital video camera to be changed and performs notification of each task event.

Figure 4:
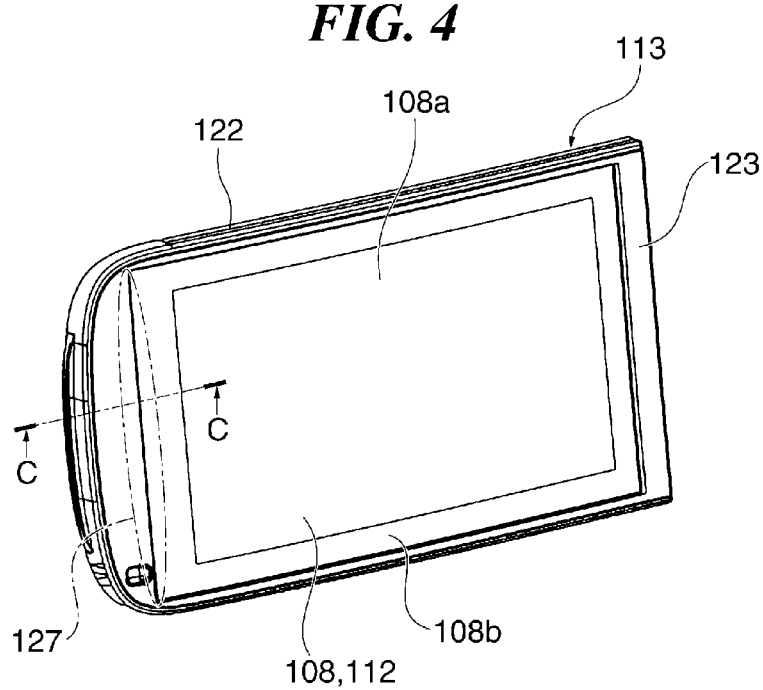
FIG. 4 is a perspective view of the appearance of the display unit, as viewed from a display surface.
Figure 5:
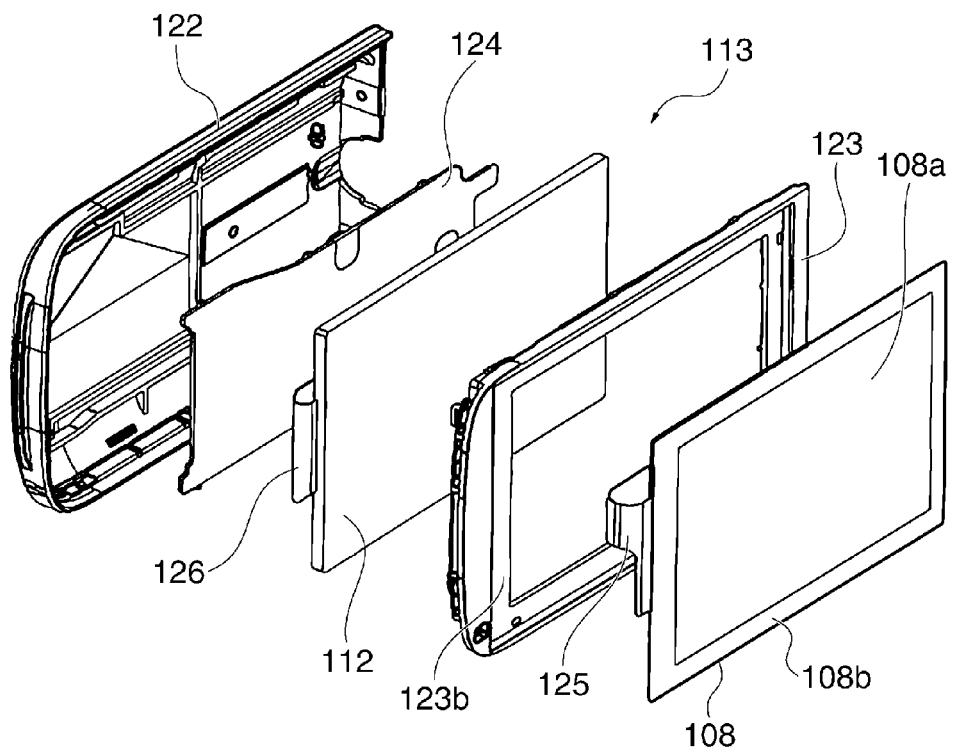
FIG. 5 is an exploded perspective view of the display unit shown in FIG. 4.
Figure 6:
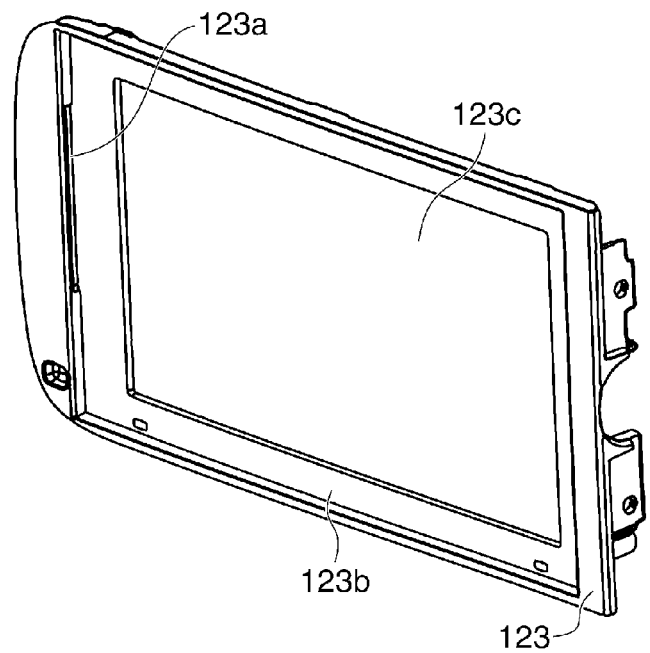
FIG. 6 is a perspective view of an inner cover of the display unit.
Figure 7:
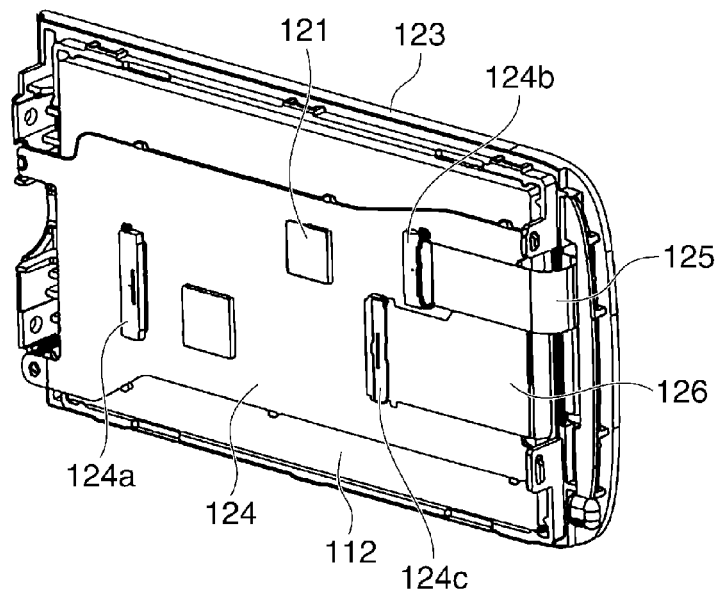
FIG. 7 is a perspective view of the display unit in a state in which an outer cover has been removed therefrom.

FIG. 4 is a perspective view of the appearance of the display unit 113, as viewed from the display surface. FIG. 5 is an exploded perspective view of the display unit 113 shown in FIG. 4. FIG. 6 is a perspective view of an inner cover 123 of the display unit 113. FIG. 7 is a perspective view of the display unit 113 in a state in which an outer cover 122 has been removed therefrom.

As shown in FIGS. 4 and 5, the display unit 113 includes the touch panel 108, the inner cover 123, the display panel 112, a substrate 124, and the outer cover 122.

An FPC 125 as an example of a touch panel signal interconnection member for transmitting an input signal detected in the position detection area 108a to the substrate 124 is electrically connected to the touch panel 108, and the FPC 125 and the touch panel 108 are formed into a unit. The touch panel 108 corresponds to an example of a panel member of the present invention, and the unit formed by electrically connecting the FPC 125 to the touch panel 108 corresponds to an example of a panel unit of the present invention.

As shown in FIG. 6, an inner portion of the inner cover 123 is formed with an opening 123c corresponding to the display panel 112. The operator can view a video displayed on the display panel 112 through the opening 123c in a state overlapping the position detection area 108a of the touch panel 108.

A front side of the inner cover 123 is formed with a receiving recess 123b around the opening 123c, in which the touch panel 108 is accommodated. Further, one side wall (left side as viewed in FIG. 6) of the receiving recess 123b of the inner cover 123 is formed with an insertion hole 123a for passing the FPC 125.

Further, the touch panel 108 is received and fixed in the receiving recess 123b e.g. with a double-sided tape or adhesive in a state in which the FPC 125 has been passed through the insertion hole 123a. In this fixed state, an exterior surface of the inner cover 123 and the surface of the touch panel 108 are substantially flush with each other. The inner cover 123 corresponds to an example of a cover member of the present invention.

The display panel 112 is disposed on a rear side of the inner cover 123. An FPC 126 as an example of a display panel signal interconnection member is fixed to the display panel 112. Electric signals of a video output from the substrate 124 are transmitted through the FPC 126 to the display panel 112.

The substrate 124 is, as shown in FIGS. 5 and 7, disposed on the rear side of the display panel 112, and is fixed to the inner cover 123 e.g. with screws, not shown. The substrate 124 has the touch panel controller 121, connectors 124a to 124c, other circuit components, and so forth, mounted thereon.

AN FPC, not shown, for transmitting electric signals from the camera body 114 is connected to the connector 124a. Further, the FPC 125 for transmitting touch panel signals is connected to the connector 124b. The FPC 126 for transmitting display panel signals is connected to the connector 124c.

Further, as shown in FIG. 5, the outer-cover 122 is fixed to the inner cover 123 e.g. with screws, not shown, in a state in which the display panel 112 and the substrate 124 are arranged between the outer cover 122 and the inner cover 123.

Figure 8:
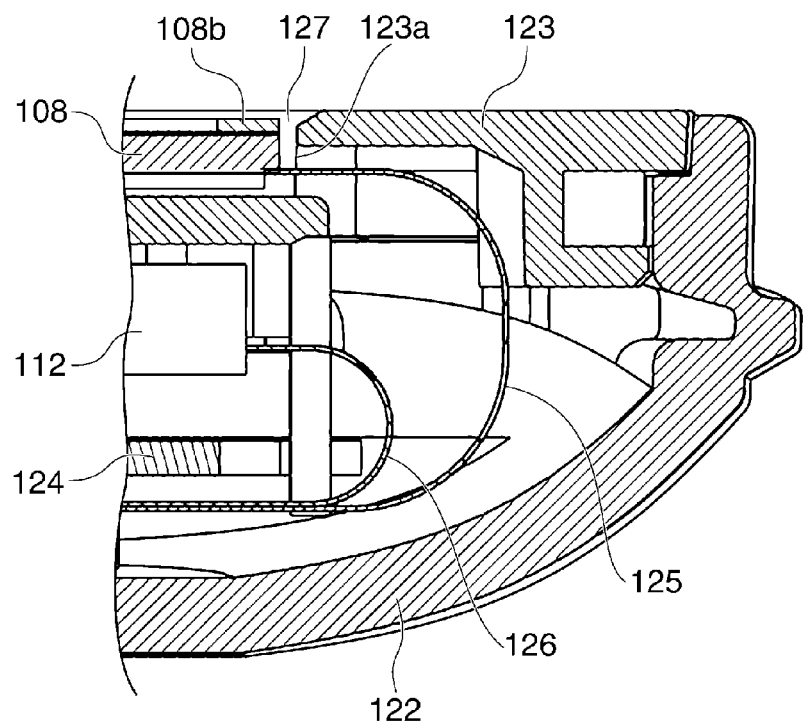
FIG. 8 is a cross-sectional view taken along C-C in FIG. 4.
Figure 9:
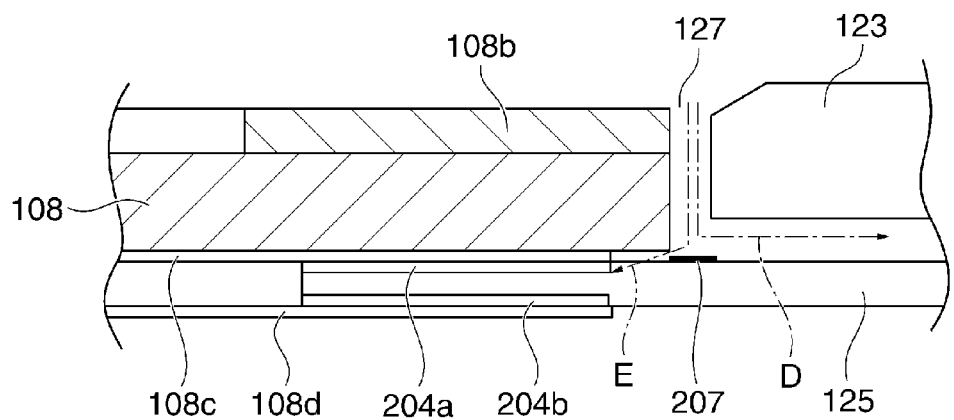
FIG. 9 is an enlarged view of part of FIG. 8.

FIG. 3 is a cross-sectional view taken along C-C in FIG. 4. FIG. 9 is an enlarged view of part of FIG. 8. In the state in which the touch panel 108 has been received in the receiving recess 123b of the inner cover 123, as shown in FIGS. 8 and 9, a gap 127 is formed between a side wall of the inner cover 123 toward the insertion hole 123a and the touch panel 108.

A black tape 207 is affixed to a portion of the FPC 125 extending at an inner portion of the gap 127. By affixing the black tape 207 to the FPC 125, it is possible to hide the FPC 125 of an eye-catching color, such as yellow or orange, which is generally formed of polyimide, from the operator. In place of the black tape 207, for example, frosting black paint, may be applied to the FPC 125. Note that in FIGS. 8 and 9, the gap 127 is exaggeratedly illustrated for convenience of explanation.

Further, in the present embodiment, a front side connection section 204a of the FPC 125 is electrically and mechanically connected to a front interconnection section 108c of the touch panel 108. Further, a reverse side connection section 204b of the FPC 125 is electrically and mechanically connected to a reverse side interconnection section 108d of the touch panel 108. Note that the front side is the operation surface side of the touch panel 108.

Figure 10A:
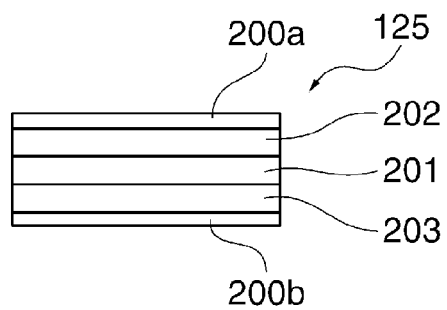
FIG. 10A is a schematic diagram of the cross-sectional structure of an FPC for touch panel signals.

FIG. 10A is a schematic diagram of the cross-sectional structure of the FPC 125 used for transmitting touch panel signals. As shown in FIG. 10A, the FPC 125 has a first copper foil layer 202 and a second copper foil layer 203 laminated on both of front and reverse sides of a base member 201 formed of e.g. polyimide, respectively.

On the first copper foil layer 202, a front-side cover film 200a formed of polyimide is laminated. On the second copper foil layer 203, a reverse side cover film 200b formed of polyimide is laminated.

Figure 10B:
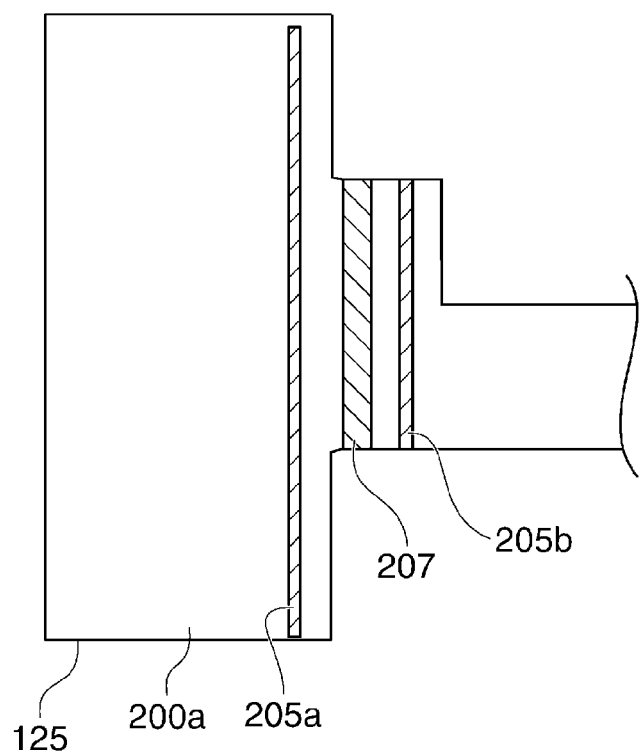
FIG. 10B is a schematic diagram of a front-side cover film and a first copper foil layer of the FPC.

FIG. 10B is a schematic diagram of the front-side cover film 200a and the first copper foil layer 202 of the FPC 125. As shown in FIG. 10B, respective portions of the FPC 125 on opposite sides across the black tape 207 in a wiring direction i.e. a longitudinal direction thereof are formed with front-side conductor-exposed portions 205a and 205b, respectively, where the first copper foil layer 202 is exposed by removing the front-side cover film 200a.

Figure 11A:
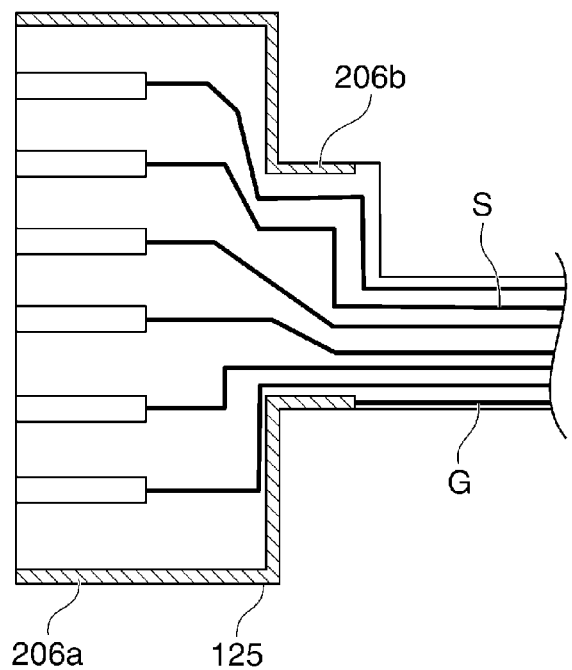
FIG. 11A is a schematic diagram of a second copper foil layer of the FPC.

FIG. 11A is a schematic diagram of the second copper foil layer 203 of the FPC 125. As shown in FIG. 11A, the second copper foil layer 203 is formed with signal lines S which are electrically connected to the interconnection sections 108c and 108d of the touch panel 108 to transmit signals from the touch panel 108 to the substrate 124.

Further, opposite sides of the second copper foil layer 203 in a lateral direction thereof are formed with end-face conductor-exposed portions 206a and 206b where the conductor is exposed to the end face along the outline of the FPC 125. A ground line G is connected to the end-face conductor-exposed portion 206a, and electrical connection with the ground of the substrate 124 is secured. The end-face conductor-exposed portions 206a and 206b correspond to an example of a reverse-side conductor-exposed portion of the present invention.

Figure 11B:
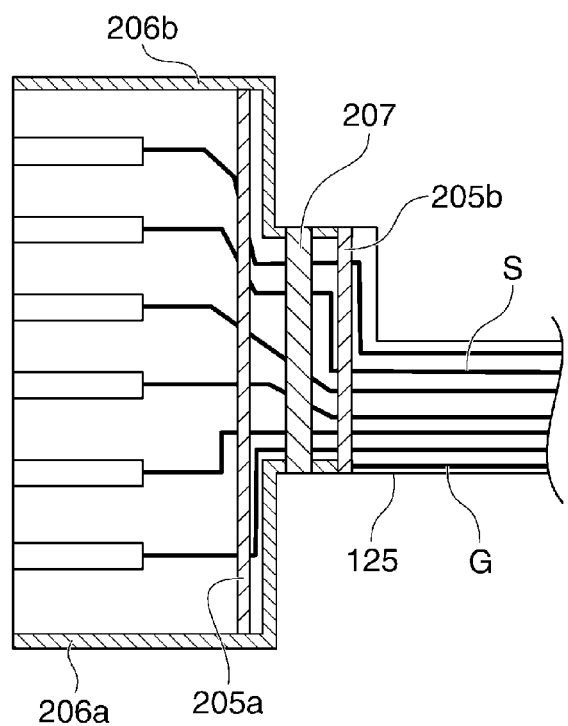
FIG. 11B is a schematic diagram showing a relationship between front-side conductor-exposed portions and end-face conductor-exposed portions.

FIG. 11B is a schematic diagram showing a relationship between the front-side conductor-exposed portions 205a and 205b, and the end-face conductor-exposed portions 206a and 206b.

As shown in FIG. 11B, the front-side conductor-exposed portions 205a and 205b are arranged such that they extend in a direction intersecting with the plurality of signal lines S. Further, the front-side conductor-exposed portions 205a and 205b nave portions which extend through the base member 201 at locations overlapping the end-face conductor-exposed portions 206a and 206b and are electrically connected to the same. With this arrangement, the front-side conductor-exposed portions 205a and 205b and the end-face conductor-exposed portions 206a and 206b secure the same ground. Note that the front-side conductor-exposed portions 205a and 205b and the end-face conductor-exposed portions 206a and 206b are prevented from being electrically connected to the signal lines S.

Figure 12:
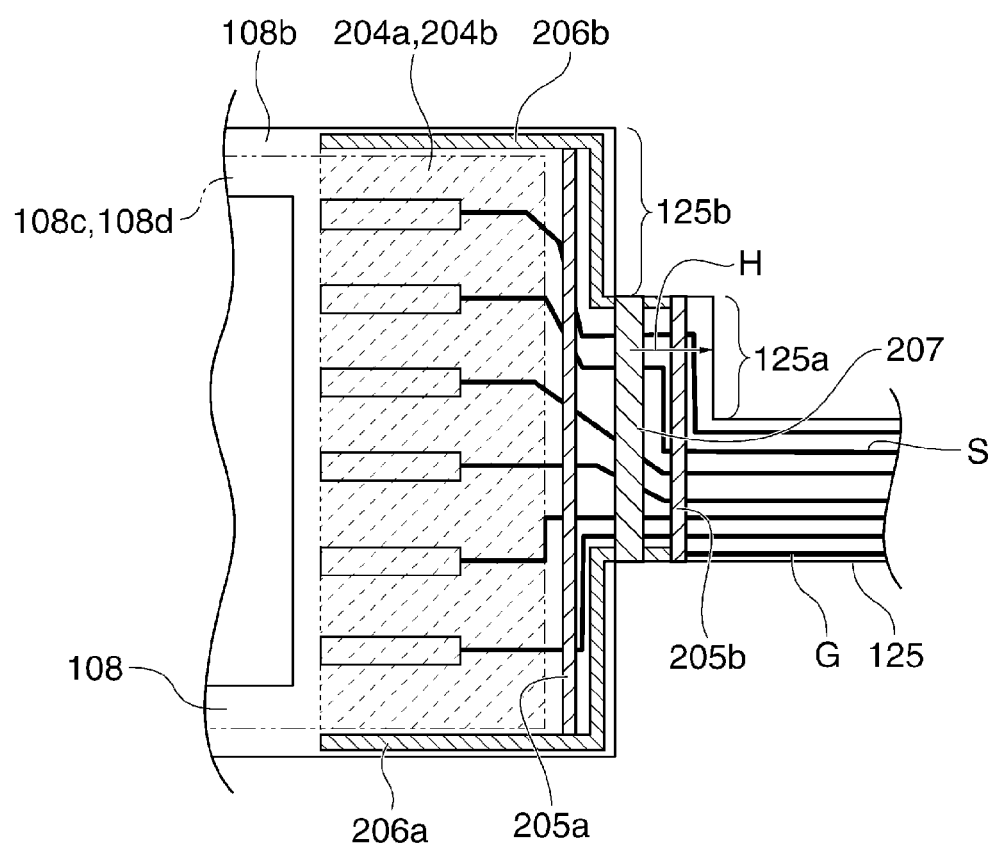
FIG. 12 is a schematic diagram showing a state in which the FPC has been attached to the touch panel.

FIG. 12 is a schematic diagram showing a state in which the FPC 125 has been attached to the touch panel 108. As shown in FIG. 12, in the present embodiment, conductor-exposed portions electrically connected to the ground line G are arranged outside the front side connection section 204a and the reverse side connection section 204b of the FPC 125, respectively. This makes it possible to effectively guide static electricity entering from the gap 127 to the ground line G, thereby making it possible to prevent the display unit 113 from malfunctioning due to static electricity.

Hereinafter, this effect will be more specifically described with reference to FIGS. 9 and 12. First, referring to FIG. 9, static electricity entering from the gap 127 toward the substrate 124 along the surface of the FPC 125 in a direction indicated by an arrow D is guided to the ground line G by the front-side conductor-exposed portion 205b.

This makes it possible to prevent static electricity from entering the interconnection section of the substrate 124 via a terminal section of the connector 124b. As a result, it is possible, for example, to prevent malfunctions, such as an error in position detection and unintended halting of the operation of the touch panel controller 121.

Further, static electricity entering from the gap 127 toward the touch panel 108 along the surface of the FPC 125 in a direction indicated by an arrow E is guided to the ground line G by the front-side conductor-exposed portion 205a.

This makes it possible to prevent static electricity from entering the interconnection section of the FPC 125 from the front side connection section 204a thereby being transferred to the substrate 124. Accordingly, similar to the above, it is possible to prevent malfunctions due to static electricity.

Further, if static electricity is applied to a portion 125b of the FPC 125 shown in FIG. 12, which does not protrude from the outer shape of the touch panel 108, static electricity may be transferred to both of the front side and reverse side of the FPC 125. If static electricity is transferred to the front side of the FPC 125, static electricity is guided to the ground line G, similarly to the case of static electricity in the above-mentioned direction E.

On the other hand, if static electricity is about to be transferred to the reverse side of the FPC 125, static electricity is guided to the ground line G by the end-face conductor-exposed portion 206b.

This makes it possible to prevent static electricity from being transferred around the end face of the FPC 125, and entering the interconnection section of the FPC 125 e.g. from the reverse side connection section 204b, thereby being transferred to the substrate 124. Similar to the above, it is possible to prevent malfunctions due to static electricity.

Further, the front-side conductor-exposed portion 205b is effective at a protruding portion 125a having an outer shape protruded from part of the FPC 125 connected to the connector 124b, for routing the interconnections of the FPC 125. That is, if static electricity is applied to the vicinity of the protruding portion 125a and is transferred in a direction indicated by an arrow H, the static electricity is guided to the ground line G by the front-side conductor-exposed portion 205b.

This makes it possible to prevent static electricity from being transferred from around the right end face of the protruding portion 125a of the FPC 125, as viewed in FIG. 12, to the reverse side, thereby being transferred to the reverse side connection section 204b.

As described above, in the present embodiment, it is possible to reduce the influence of static electricity applied to the touch panel 108 without increasing the size of the display unit 113, and in turn, the size of the digital video camera.

Although in the present embodiment, the description has been given of the case where the gap 127 is formed between one side wall of the inner cover 123 toward the insertion hole 123a and the touch panel 108, by way of example, it is possible to provide the same advantageous effects also in a case where the gap 127 is not formed.

Next, a description will be given of a smartphone as an electronic apparatus according to a second embodiment of the present invention, with reference to FIGS. 13 to 17A and 17B. Although the smartphone will be described here as an example of the electronic apparatus, it is not essential to the present invention that the electronic apparatus has a communication function. The present embodiment may be applied to any other electronic apparatus, such as a tablet device, a portable music player, a game console, and an electronic book reader, insofar as it includes a touch panel. Components corresponding to those of the first embodiment are denoted by the same reference numerals, and description thereof is omitted.

Figure 13:
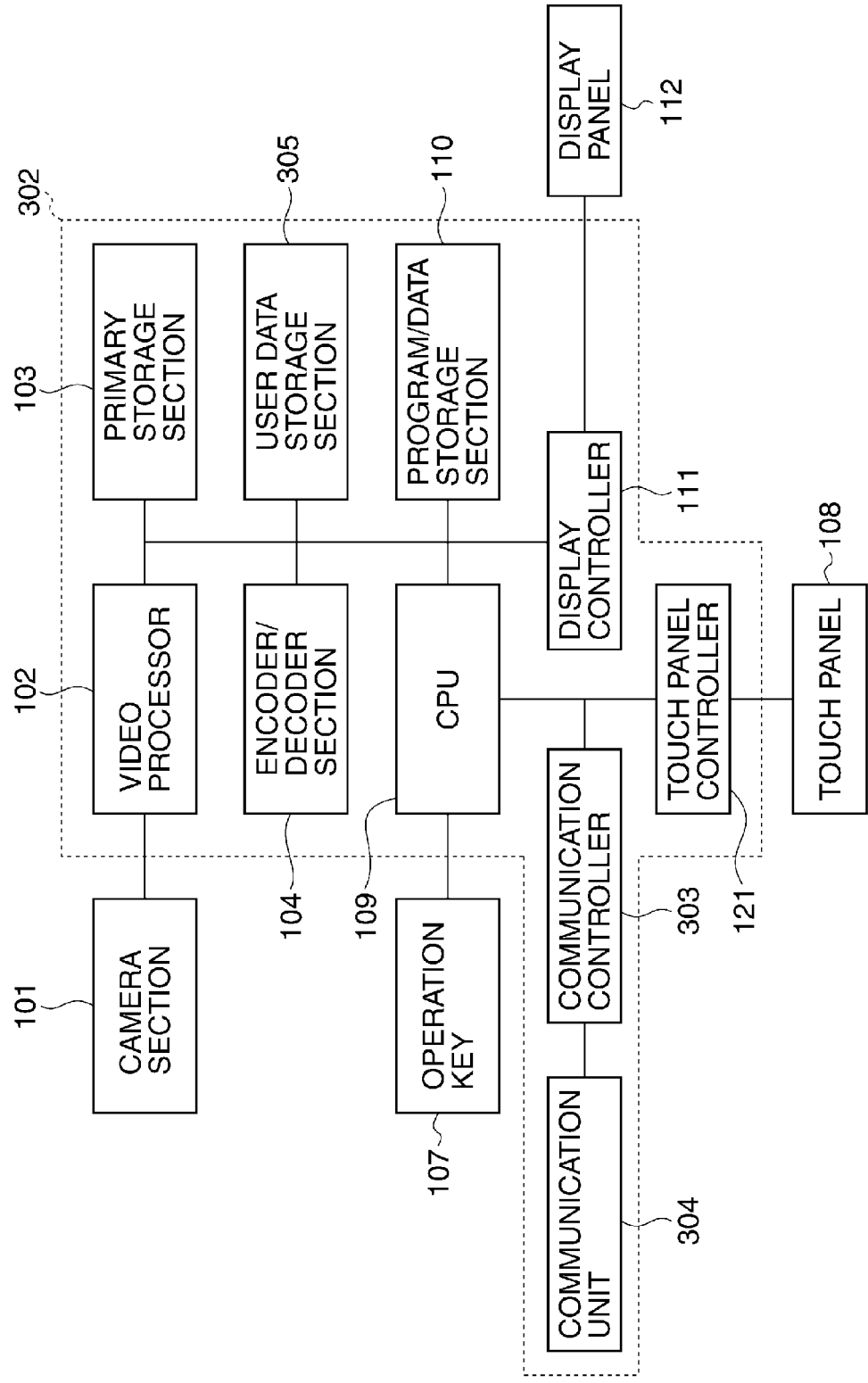
FIG. 13 is a schematic block diagram of a control system of a smartphone as an electronic apparatus according to a second embodiment of the present invention.
Figure 14:
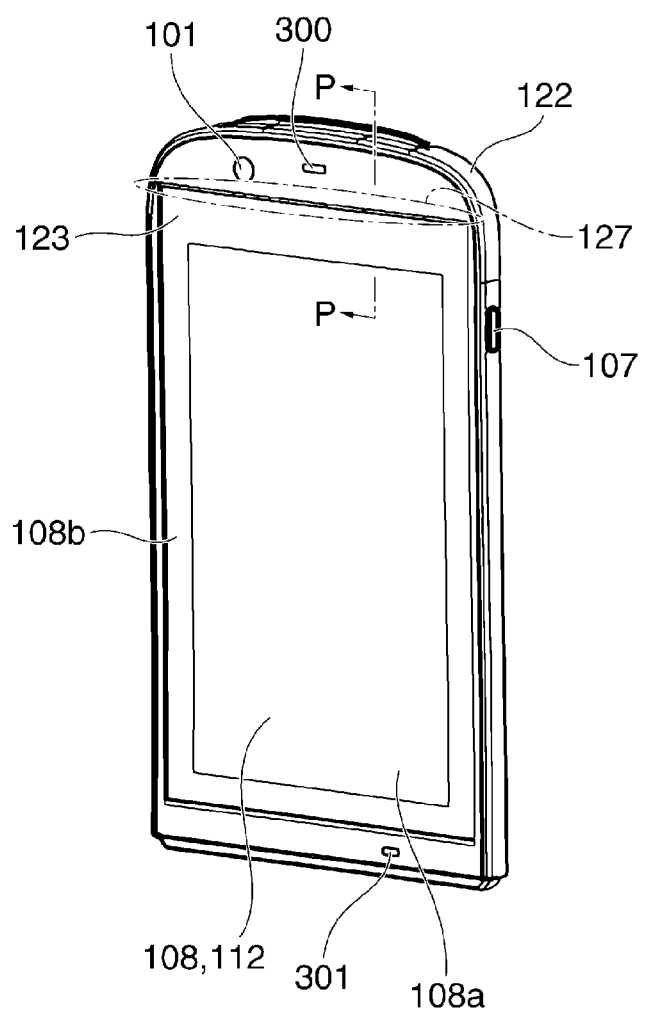
FIG. 14 is a perspective view of the appearance of the smartphone.
Figure 15:
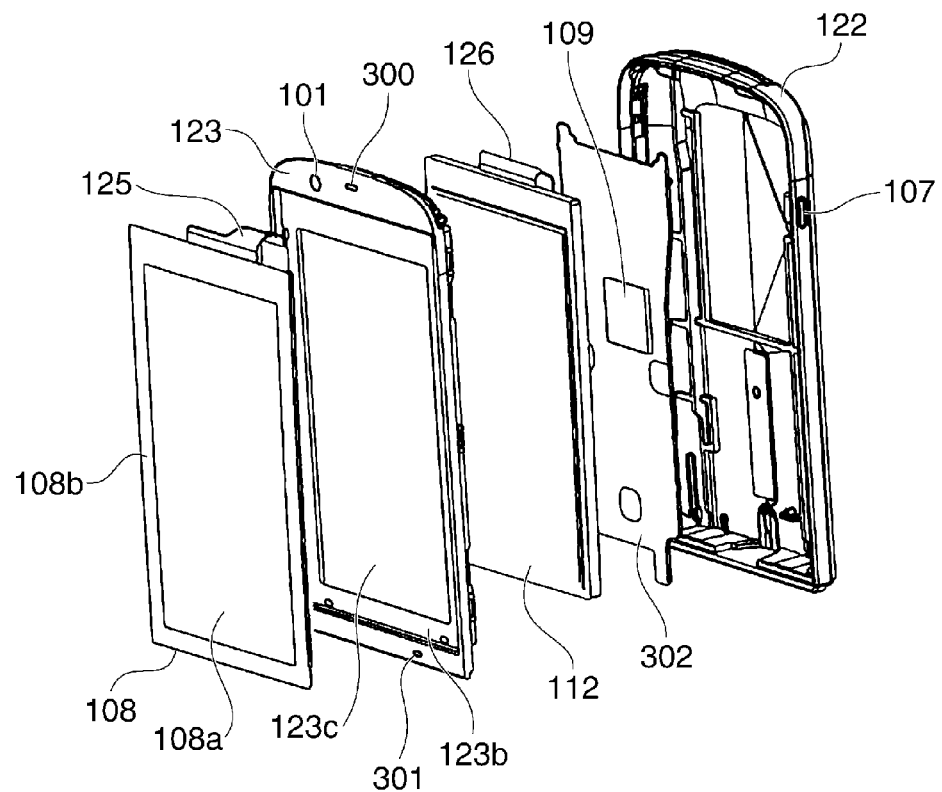
FIG. 15 is an exploded perspective view of the smartphone.

FIG. 13 is a schematic block diagram of a control system of the smartphone as the electronic apparatus according to the present embodiment. FIG. 14 is a perspective view of the appearance of the smartphone. FIG. 15 is an exploded perspective view of the smartphone.

The smartphone according to the present embodiment includes, as shown in FIGS. 13 to 15, the electrostatic capacity-type touch panel 108, the inner cover 123, the display panel 112, a main substrate 302, and the outer cover 122.

The inner cover 123 is provided with a speaker 300 and a microphone 301 as well as the camera section 101, on a side toward the operation surface of the touch panel 108. The outer cover 122 is provided with the operation key 107 as a power button, on a lateral side thereof.

As shown in FIG. 13, a communication controller 303 controlled by the CPU 109, a communication unit (antenna) 304, a user data storage section 305, and so forth are mounted on the main substrate 302. The communication controller 303 performs the overall control of communication functions, including a telephone function and a network connection function. It is preferred that an antenna section of the communication unit 304 is made of resin because a metal material blocks electric waves.

The user data storage section 305 stores moving image data, user data, etc. The user data storage section 305 stores the moving image data acquired e.g. via the camera section 101 as well as various data, such as image data and application data which are downloaded via the communication unit 304 driven by the communication controller 303. Other circuit components and the like which are mounted on the main substrate 302 are the same as those of the first embodiment.

The camera section. 101, the speaker 300, and the microphone 301, provided on the inner cover 123 are connected to the main substrate 302 by an interconnection member, not shown, such as an FPC. Further, the operation key 107 provided on the outer cover 122 is also connected to the main substrate 302 by an interconnection member, not shown.

Figure 16:
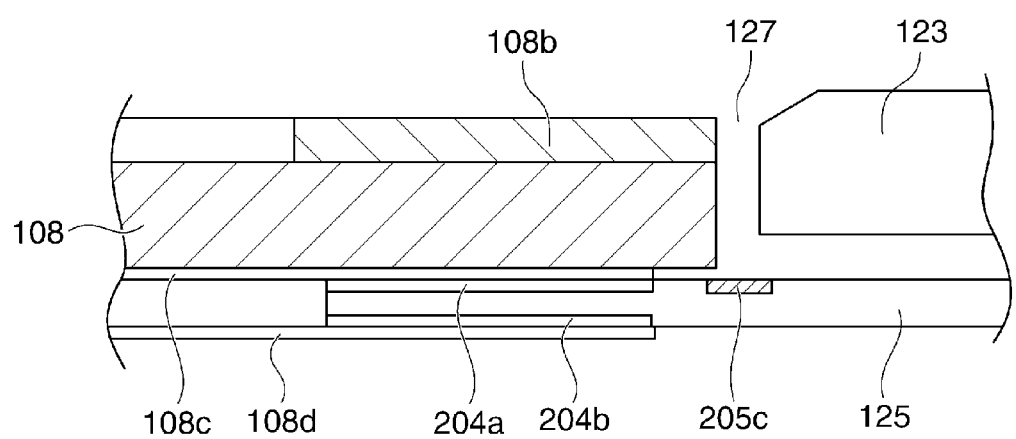
FIG. 16 is a schematic diagram of a cross section taken along P-P in FIG. 14.

FIG. 16 is a schematic diagram of a cross section taken along P-P in FIG. 14. As shown in FIG. 16, in the present, embodiment, a front-side conductor-exposed portion 205c is provided such that it extends through an inner portion of the gap 12.7.

Figure 17A:
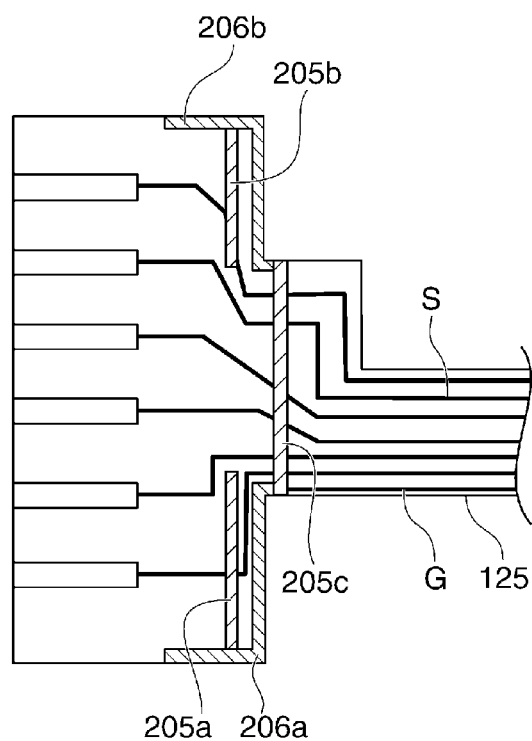
FIG. 17A is a schematic diagram showing a relationship between front-side conductor-exposed portions and end-face conductor-exposed portions.

FIG. 17A is a schematic diagram showing a relationship between the front-side conductor-exposed portions 205a to 205c, and the end-face conductor-exposed portions 206a and 206b.

As shown in FIG. 17A, in the present embodiment, the three front-side conductor-exposed portions 205a to 205c are provided and the front-side conductor-exposed portions 205a to 205c are arranged in a manner intersecting with the signal lines S. Further, the front-side conductor-exposed portions 205a to 205c have portions which extend through the base member 201 at locations overlapping the end-face conductor-exposed portions 206a and 206b and are electrically connected to the same. With this arrangement, the front-side conductor-exposed portions 205a to 205c and the end-face conductor-exposed portions 206a and 206b secure the same ground and are electrically connected to the ground line G.

Figure 17B:
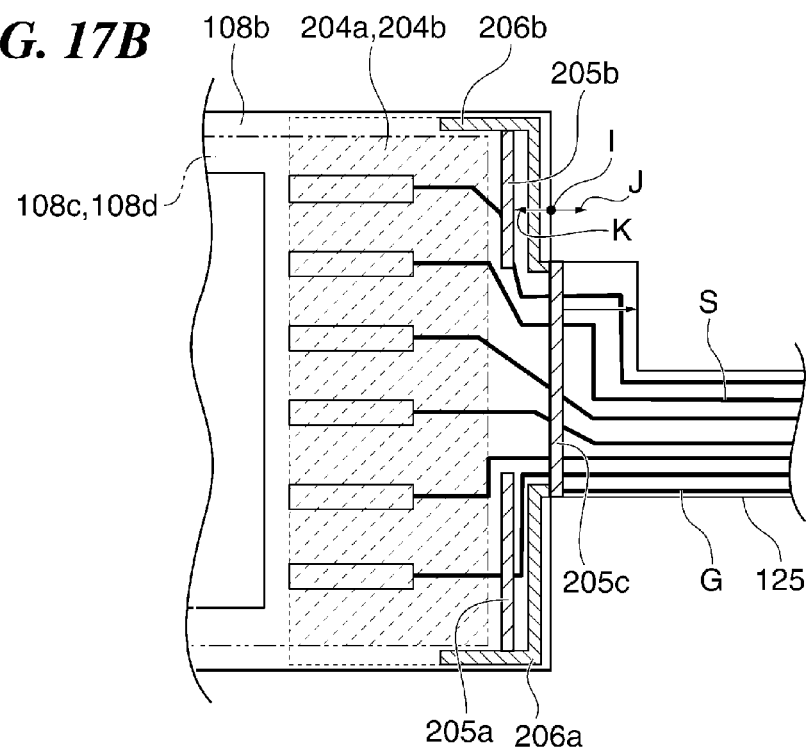
FIG. 17B is a schematic diagram showing a state in which an FPC has been attached to a touch panel.

FIG. 17B is a schematic diagram showing a state in which the FPC 125 has been attached to the touch panel 108.

As shown in FIG. 17B, in the present embodiment, the front-side conductor-exposed portion 205c is disposed at a location corresponding to the gap 127. This makes it possible to guide static electricity entering from the gap 127, to the ground line G via the front-side conductor-exposed portion 205c. Further, when static electricity is applied to the FPC 125 at a location other than the location corresponding to the gap 127, e.g. at a location I in FIG. 17B, static electricity is transferred in a direction indicated by an arrow J or K. Static electricity transferred in the direction indicated by the arrow K is guided to the ground line G by the front-side conductor-exposed portion 205b. Static electricity transferred in the direction indicated by the arrow J is transferred around the end face of the FPC 125 to the reverse side and then is guided to the ground line G by the end-face conductor-exposed portion 206b.

As described above, in the present embodiment, it is possible to reduce the influence of static electricity applied to the touch panel 108 without increasing the size of the smartphone. The other configuration and advantageous effects are similar to those described as to the first embodiment.

Next, a description will be given of a digital video camera as an electronic apparatus according to a third embodiment of the present invention, with reference to FIGS. 18 to 20. Components corresponding to those of the first embodiment are denoted by the same reference numerals, and description thereof is omitted.

Figure 18:
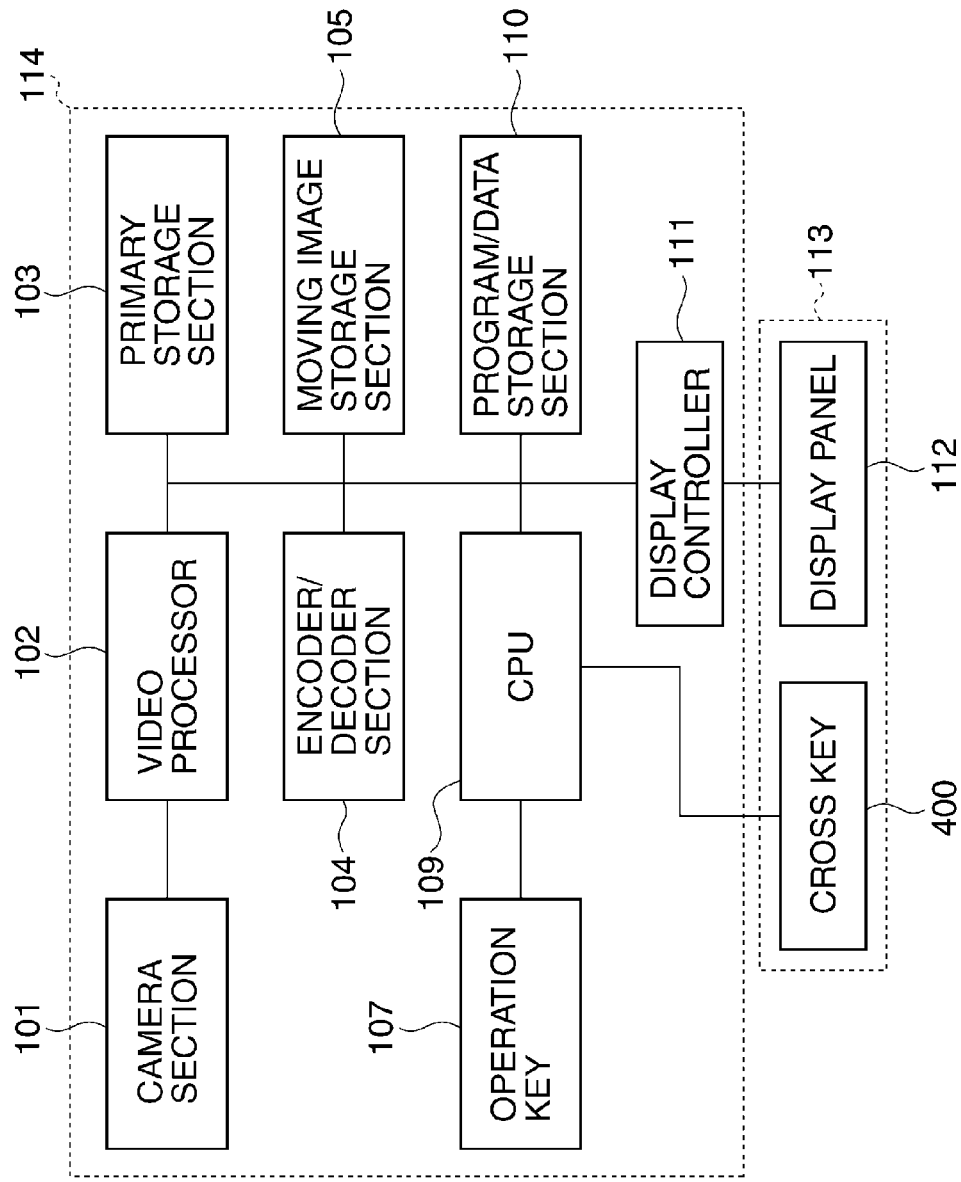
FIG. 18 is a schematic block diagram of a control system of a digital video camera as an electronic apparatus according to a third embodiment of the present invention.
Figure 19A:
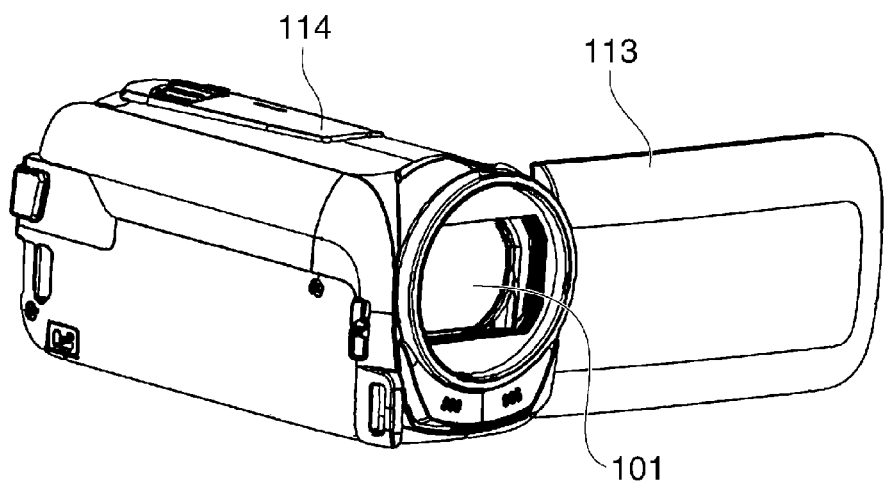
FIG. 19A is a perspective view of the appearance of the digital video camera, as viewed from the front.
Figure 19B:
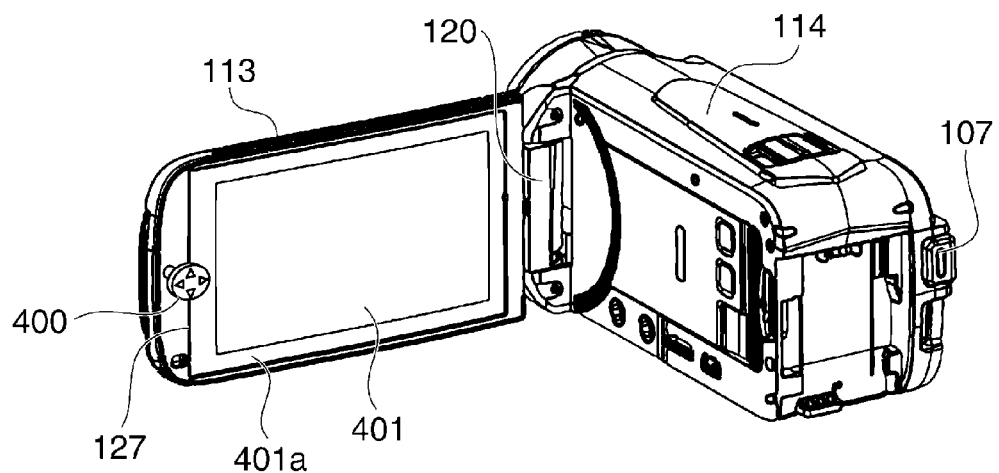
FIG. 19B is a perspective view of the appearance of the digital video camera shown in FIG. 19A, as viewed from the rear.

FIG. 18 is a schematic block diagram of a control system of the digital video camera. FIG. 19A is a perspective view of the appearance of the digital video camera, as viewed from the front. FIG. 19B is a perspective view of the appearance of the digital video camera shown in FIG. 19A, as viewed from the rear.

In the present embodiment, as a display panel 401 of the display unit 113, an organic EL (organic electro-luminescence) panel is employed. Further, a touch panel is not mounted on the display unit 113, but a cross key 400 as an operation unit is mounted.

The cross key 400 makes it possible to select five kinds of operations by a depressing operation in upper, lower, right, left, and direct-downward directions. The CPU 109 controls various operations, such as operations for moving and selecting a cursor or the like displayed on the display panel 401, based on output signals generated according to the five kinds of operations.

Figure 20:
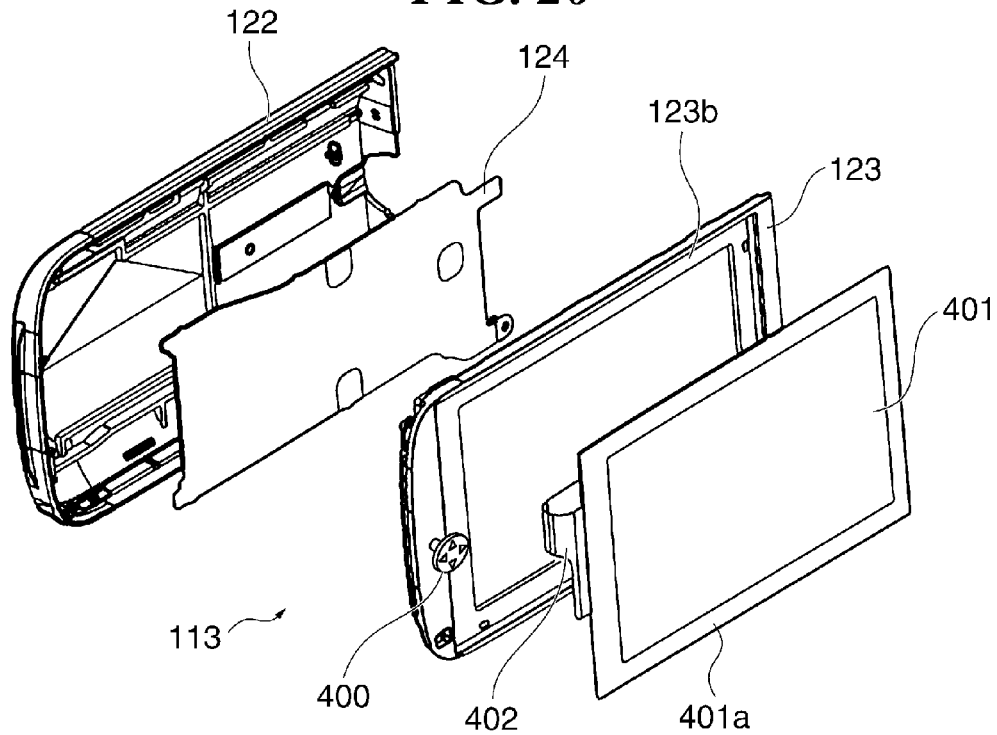
FIG. 20 is an exploded perspective view of a display unit of the digital video camera.
Figure 21:
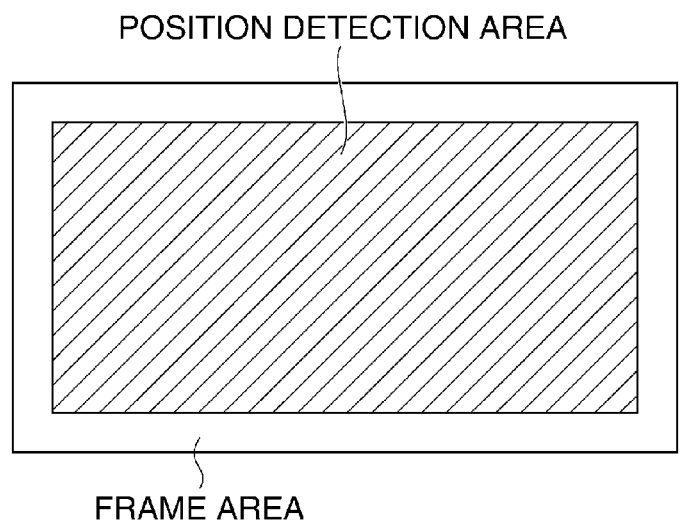
FIG. 21 is a diagram useful in explaining a position detection area and a frame area of a conventional touch panel.

FIG. 20 is an exploded perspective view of the display unit. As shown in FIG. 20, a frame area 401*a* is provided outside the display area of the display panel 401. An interconnection section etc. are arranged on the frame area 401*a*. In the present embodiment, the frame area 401*a* is formed by printing, with black paint, a rectangular frame shape on a cover glass which is the outermost surface of the display panel 401.

Further, the rear side of the display panel 401 (side of the display panel 401 toward the outer cover 122) is provided with a drive circuit, not shown, for driving each light emitting device. An FPC 402 for transmitting display panel signals is electrically connected to the drive circuit, and the FPC 402 and the display panel 401 are formed into a unit. The display panel 401 corresponds to an example of the panel member of the present invention. The unit formed by electrically connecting the FPC 402 to the display panel 401 corresponds to an example of the panel unit of the present invention.

The inner cover 123 is provided with a substrate having the cross key 400 and a detection switch, not shown, mounted thereon, which are connected to the substrate 124 by an interconnection member, not shown, such as an FPC. Further, the inner cover 123 is formed with the receiving recess 123*b*. The display panel 401 is fixed in the receiving recess 123*b* e.g. with a double-sided tape, not shown.

Similar to the FPC 125 of the first embodiment, the FPC 402 is connected to the substrate 124 through the insertion hole 123*a* (see FIG. 6) formed through one side wall of the receiving recess 123*b*. The cross key 400 is arranged in the vicinity of the gap 127.

The structure of a countermeasure against static electricity provided on the FPC 402 for use in transmitting the display panel signals is the same as that on the FPC 125 shown in FIGS. 10A to 12, and hence description thereof is omitted. In the present embodiment, a position where the operator touches the display unit 113 with his/her finger is in the vicinity of the cross key 400. Therefore, it is also possible to form a conductor-exposed portion only at a location corresponding to the gap 127 in the vicinity of the cross key 400.

As described above, in the present embodiment, it is possible to reduce, the influence of static electricity applied to the display panel 401 without increasing the size of the display unit 113, and in turn, the size of the digital video camera. The other configuration and advantageous effects are similar to those described as to the first embodiment.

Note that the present invention is not limited to the above-described embodiments, but the material, shape, dimension, form, number, and location of each of the components can be modified on an as-needed basis, without departing from the spirit and scope thereof.

For example, the connection between the connection sections 204*a* and 204*b* of the FPC 125, and the interconnection sections 108*c* and 108*d* of the touch panel 108, shown in FIG. 9, can be changed to connection only on the front side or the reverse side of the FPC 125.

Further, it is possible to join the interconnection sections 108*c* and 108*d* of the touch panel 108 to the connection sections 204*a* and 204*b* of the FPC 125 without causing them to overlap each other, by forming each of the interconnection sections 108*c* and 108*d* of the touch panel 108 and the connection sections 204*a* and 204*b* of the FPC 125 into a comb-like shape and causing them to be alternately meshed with each other on the same level.

Further, it is possible to arrange the front-side conductor-exposed portions 205*a* and 205*b* of 205 only on portions intersecting with the signal lines S, and form all of the other exposed portions as the end-face conductor-exposed portions 206*a* and 206*b*. All of the end-face conductor-exposed portions 206*a* and 206*b* can be exposed also on the front side. Further, for example, it is also possible to provide ground interconnections separately and additionally at opposite lateral side locations outward of the outermost ones of the signal lines S, and only the front-side conductor-exposed portions can be provided so as to protect only portions extending to the signal lines S.

Further, it is also possible to electrically connect conductor-exposed portions to the ground interconnections of the touch panel or the display panel itself. This makes it possible to prevent the number of interconnections from being increased.

Further, the touch panel 108 can be implemented by the resistance film-type touch panel in place of the electrostatic capacity-type touch panel.

Further, although the non-conductive resin material is used as the material of the inner cover 123 and the outer cover 122, metallic material can also be used. The metallic material is effective in a case where it is difficult to connect the inner cover 123 and the outer cover 122 to an inner frame or ground of the substrate.

Further, although in the present embodiment, a flat panel-type display unit is described by way of example, the present invention is not limited to this.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-279468, filed Dec. 21, 2012, which is hereby incorporated by reference herein in its entirety.

What is claimed is:

1. A panel unit comprising:
    a panel member that forms a surface of displaying an image, said panel member having interconnection sections; and
    a signal interconnection member that includes connection sections, which are electrically connected to said interconnection sections of said panel member, signal lines, which are electrically connected to said connection sections, a ground interconnection, and conductor-exposed portions, which are configured to be prevented from being electrically connected to said signal lines and to be electrically connected to said ground interconnection.

2. The panel unit according to claim 1, wherein said conductor-exposed portions include:
    front-side conductor-exposed portions each of which are provided on a front side of said signal interconnection member facing to said panel member; and
    reverse-side conductor-exposed portions each of which are provided on a reverse side of said signal interconnection member and is electrically connected to said front-side conductor-exposed portions.

3. The panel unit according to claim 1, wherein said panel member is a touch panel or a display panel.

4. An electronic apparatus comprising:
a panel unit including:
a panel member that forms a surface of displaying an image, said panel member having interconnection sections, and
a signal interconnection member that includes connection sections, which are electrically connected to said interconnection sections of said panel member, signal lines, which are electrically connected to said connection sections, a ground interconnection, and conductor-exposed portions, which are configured to be prevented from being electrically connected to said signal lines and to be electrically connected to said ground interconnection.

5. The electronic apparatus according to claim 4, wherein said conductor-exposed portions include:
front-side conductor-exposed portions each of which are provided on a front side of said signal interconnection member facing to said panel member; and
reverse-side conductor-exposed portions each of which are provided on a reverse side of said signal interconnection member and is electrically connected to said front-side conductor-exposed portions.

6. The electronic apparatus according to claim 4, further comprising a cover member accommodating said panel member,
wherein said signal interconnection member is disposed such that said signal interconnection member extends in a manner passing the a gap between said panel member and said cover member, and
wherein a part of said conductor-exposed portions are each provided on said signal interconnection member at a location corresponding to the gap.

7. The electronic apparatus according to claim 4, further comprising a cover member accommodating said panel member,
wherein said signal interconnection member is disposed such that said signal interconnection member extends in a manner passing a gap between said panel member and said cover member, and
wherein a part of said conductor-exposed portions are provided on opposite sides across a location of corresponding to the gap in a wiring direction of the signal lines, respectively.

8. The electronic apparatus according to claim 4, wherein a part of said conductor-exposed portions are arranged along a direction intersecting with the signal lines.

9. The electronic apparatus according to claim 4, wherein a part of said conductor-exposed portions are arranged along at least opposite lateral sides of said connection sections.

10. The electronic apparatus according to claim 4, wherein the panel member is a touch panel or a display panel.

11. The panel unit according to claim 1, further comprising a cover member accommodating said panel member,
wherein said signal interconnection member is disposed such that said signal interconnection member extends in a manner passing a gap between said panel member and said cover member, and
wherein a part of said conductor-exposed portions are each provided on said signal interconnection member at a location corresponding to the gap.

12. The panel unit according to claim 1, further comprising a cover member accommodating said panel member,
wherein said signal interconnection member is disposed such that said signal interconnection member extends in a manner passing a gap between said panel member and said cover member, and
wherein a part of said conductor-exposed portions are provided on opposite sides across the a location of corresponding to the gap in a wiring direction of the signal lines, respectively.

13. The panel unit according to claim 1, wherein a part of said conductor-exposed portions are arranged along a direction intersecting with the signal lines.

14. The panel unit according to claim 1, wherein a part of said conductor-exposed portions are arranged along at least opposite lateral sides of said connection sections.

15. The electronic apparatus according to claim 4, further comprising a communication unit.

16. The electronic apparatus according to claim 4, further comprising a camera unit.

* * * * *